(12) United States Patent
Park et al.

(10) Patent No.: US 8,563,846 B2
(45) Date of Patent: Oct. 22, 2013

(54) THIN FILM TYPE SOLAR CELL AND METHOD FOR MANUFACTURING THE SAME

(75) Inventors: Won Seok Park, Seongnam-si (KR); Yong Woo Shin, Yongin-si (KR); Seong Ryong Hwang, Seoul (KR)

(73) Assignee: Jusung Engineering Co., Ltd., Gwangju-Si (KR)

( * ) Notice: Subject to any disclaimer, the term of this patent is extended or adjusted under 35 U.S.C. 154(b) by 512 days.

(21) Appl. No.: 12/811,085

(22) PCT Filed: Dec. 29, 2008

(86) PCT No.: PCT/KR2008/007737
§ 371 (c)(1),
(2), (4) Date: Jun. 28, 2010

(87) PCT Pub. No.: WO2009/084888
PCT Pub. Date: Jul. 9, 2009

(65) Prior Publication Data
US 2010/0282303 A1    Nov. 11, 2010

(30) Foreign Application Priority Data

Dec. 31, 2007    (KR) .......................... 10-2007-0141220

(51) Int. Cl.
*H02N 6/00*    (2006.01)
*H01L 31/042*    (2006.01)
*H01L 31/00*    (2006.01)
*H01L 21/00*    (2006.01)

(52) U.S. Cl.
USPC ........... 136/244; 136/249; 136/252; 136/255; 136/256; 438/57; 438/80

(58) Field of Classification Search
USPC ............ 136/244, 249, 252, 256, 255; 438/80, 438/57
See application file for complete search history.

(56) References Cited

U.S. PATENT DOCUMENTS

| 4,315,096 | A | | 2/1982 | Tyan et al. |
| 4,518,815 | A | * | 5/1985 | Yamazaki ..................... 136/244 |

(Continued)

FOREIGN PATENT DOCUMENTS

| JP | 2004-039891 A | 2/2004 |
| KR | 10-2006-0083164 A | 7/2006 |

OTHER PUBLICATIONS

Masahiro Kuroda, Kazutaka Uda, Yasuhiro Yamauchi and Soji Kokaji; "Thin Film Solar Cell Manufacturing Method and It's Apparatus"; Patent Abstracts of Japan; English Abstract of Publication No. 2004-039891; Publication Date: Feb. 5, 2004; Japan Patent Office, Japan.

(Continued)

*Primary Examiner* — Jonathan Johnson
*Assistant Examiner* — Lindsey Bernier
(74) *Attorney, Agent, or Firm* — Murabito, Hao & Barnes LLP; Andrew D. Fortney

(57) ABSTRACT

A thin film type solar cell and a method for manufacturing the same is disclosed, the thin film type solar cell comprising a substrate; a plurality of front electrodes on the substrate at fixed intervals by each first separating part interposed in-between; a plurality of semiconductor layers on the front electrodes at fixed intervals by each contact part interposed in-between; and a plurality of rear electrodes connected with the front electrodes through the contact part, provided at fixed intervals by each second separating part interposed in-between, wherein a main isolating part is formed in the outermost front electrode, the outermost semiconductor layer, and the outermost rear electrode, wherein an auxiliary isolating part is formed in at least one of the outermost front electrode and the outermost rear electrode, wherein the auxiliary isolating part is positioned on the inside of the main isolating part.

20 Claims, 5 Drawing Sheets

(56) References Cited

U.S. PATENT DOCUMENTS

2002/0066478 A1* 6/2002 Hayashi et al. .............. 136/244
2006/0157105 A1 7/2006 Nishi et al.

OTHER PUBLICATIONS

Kazuo Nishi, Tomoyuki Aoki, Toshiyuki Isa and Gen Fujii; "Solar Cell and Semiconductor Device, and Manufacturing Method Thereof"; Korean Patent Abstracts; English Abstract of Publication No. 1020060083164 A; Publication Date: Jul. 20, 2006; Korean Intellectual Property Office, Republic of Korea.

PCT International Search Report; PCT International Application No. PCT/KR2008/007737; Dated Aug. 18, 2009; 3 pages; International Searching Authority/Korean Intellectual Property Office, Daejeon, Republic of Korea.

* cited by examiner

THIN FILM TYPE SOLAR CELL AND METHOD FOR MANUFACTURING THE SAME

TECHNICAL FIELD

The present invention relates to a thin film type solar cell, and more particularly, to a thin film type solar cell with a plurality of unit cells connected in series.

BACKGROUND ART

A solar cell with a property of semiconductor converts a light energy into an electric energy.

A structure and principle of the solar cell according to the related art will be briefly explained as follows. The solar cell is formed in a PN-junction structure where a positive(P)-type semiconductor makes a junction with a negative(N)-type semiconductor. When a solar ray is incident on the solar cell with the PN-junction structure, holes(+) and electrons(−) are generated in the semiconductor owing to the energy of the solar ray. By an electric field generated in an PN-junction area, the holes(+) are drifted toward the P-type semiconductor, and the electrons(−) are drifted toward the N-type semiconductor, whereby an electric power is produced with an occurrence of electric potential.

The solar cell can be largely classified into a wafer type solar cell and a thin film type solar cell.

The wafer type solar cell uses a wafer made of a semiconductor material such as silicon. In the meantime, the thin film type solar cell is manufactured by forming a semiconductor in type of a thin film on a glass substrate.

With respect to efficiency, the wafer type solar cell is better than the thin film type solar cell. However, in the case of the wafer type solar cell, it is difficult to realize a small thickness due to difficulty in performance of the manufacturing process. In addition, the wafer type solar cell uses a high-priced semiconductor substrate, whereby its manufacturing cost is increased.

Even though the thin film type solar cell is inferior in efficiency to the wafer type solar cell, the thin film type solar cell has advantages such as realization of thin profile and use of low-priced material. Accordingly, the thin film type solar cell is suitable for a mass production.

The thin film type solar cell is manufactured by sequential steps of forming a front electrode on a glass substrate, forming a semiconductor layer on the front electrode, and forming a rear electrode on the semiconductor layer. In this case, since the front electrode corresponds to a light-incidence face, the front electrode is made of a transparent conductive material, for example, ZnO. With the increase in size of substrate, a power loss increases due to a resistance of the transparent conductive layer.

Thus, a method for minimizing the power loss has been proposed, in which the thin film type solar cell is divided into a plurality of unit cells connected in series. This method enables the minimization of power loss caused by the resistance of the transparent conductive material.

Hereinafter, a related art method for manufacturing a thin film type solar cell with a plurality of unit cells connected in series will be described with reference to FIGS. 1A to 1G.

FIGS. 1A to 1G are cross section views illustrating a related art method for manufacturing a thin film type solar cell with a plurality of unit cells connected in series.

First, as shown in FIG. 1A, a front electrode layer 20a is formed on a substrate 10, wherein the front electrode layer 20a is made of a transparent conductive material, for example, ZnO.

As shown in FIG. 1B, a plurality of front electrodes 20 are formed by patterning the front electrode layer 20a, wherein the plurality of front electrodes 20 are provided at fixed intervals by each first separating portion 21 interposed in-between.

As shown in FIG. 1C, a semiconductor layer 30a is formed on an entire surface of the substrate 10 including the front electrodes 20.

As shown in FIG. 1D, a plurality of semiconductor layers 30 are formed by patterning the semiconductor layer 30a, wherein the plurality of semiconductor layers 30 are provided at fixed intervals by each contact part 35 interposed in-between.

As shown in FIG. 1E, a rear electrode layer 50a is formed on an entire surface of the substrate 10.

As shown in FIG. 1F, a plurality of rear electrodes 50 are formed by patterning the rear electrode layer 50a, wherein the plurality of rear electrodes 50 are provided at fixed intervals by each second separating portion 51 interposed in-between. When patterning the rear electrode layer 50a, the semiconductor layer 30 positioned underneath the rear electrode layer 50a is patterned together.

As shown in FIG. 1G, an isolating part 55 is formed by patterning the outermost front electrode 20, the outermost semiconductor layer 30, and the outermost rear electrode 50, thereby completing the process for manufacturing the thin film type solar cell.

During a modular process of the completed thin film type solar cell, a predetermined housing is connected with the thin film type solar cell. At this time, the outermost isolating part 55 prevents a short from occurring between the housing and the thin film type solar cell.

For forming the isolating part 55, a laser-scribing process is necessarily performed. In this case, if the front electrode 20 and rear electrode 50 are removed completely as shown in the left-side outermost portion of FIG. 1G, it makes no problems. However, if the front electrode 20 and rear electrode 50 are removed incompletely as shown in the right-side outermost portion of FIG. 1G, the remaining front electrode 20 and rear electrode 50 may be partially melted and connected with each other by laser beams. According as the melted front electrode 20 and rear electrode 50 are connected with each other, the short may occur therein, whereby the corresponding unit cell can not perform a cell function.

DISCLOSURE

Technical Problem

Therefore, the present invention has been made in view of the above problems, and it is an object of the present invention to provide a thin film type solar cell and method for manufacturing the same, which is capable of preventing one or more problems of the related art.

An object of the present invention is to provide a thin film type solar cell and a method for manufacturing the same, which is capable of preventing a short from occurring in a unit cell even though front and rear electrodes are connected with each other during a process for forming a separating part in the outermost portion of the thin film type solar cell.

Technical Solution

To achieve these objects and other advantages and in accordance with the purpose of the invention, as embodied and broadly described herein, a thin film type solar cell comprises a substrate; a plurality of front electrodes formed on the substrate, wherein the plurality of front electrodes are provided at fixed intervals by each first separating part interposed in-between; a plurality of semiconductor layers formed on the front electrodes, wherein the plurality of semiconductor layers are provided at fixed intervals by each contact part interposed in-between; and a plurality of rear electrodes connected with the front electrodes through the contact part, wherein the plurality of rear electrodes are provided at fixed intervals by each second separating part interposed in-between, wherein a main isolating part is formed in the outermost front electrode, the outermost semiconductor layer, and the outermost rear electrode among the plurality of front electrodes, semiconductor layers, and rear electrodes, wherein an auxiliary isolating part is formed in at least one of the outermost front electrode and the outermost rear electrode, wherein the auxiliary isolating part is positioned on the inside of the main isolating part.

At this time, the auxiliary isolating part is comprised of a first auxiliary isolating part formed in the outermost front electrode.

Also, the auxiliary isolating part is comprised of a second auxiliary isolating part formed in the outermost rear electrode.

Also, the auxiliary isolating part is comprised of a first auxiliary isolating part formed in the outermost front electrode, and a second auxiliary isolating part formed in the outermost rear electrode.

The second auxiliary isolating part is additionally formed in the outermost semiconductor layer.

The second auxiliary isolating part is formed between the first auxiliary isolating part and the main isolating part.

In addition, the thin film type solar cell further comprises a transparent conductive layer formed between the semiconductor layer and the rear electrode, wherein the transparent conductive layer is identical in pattern to the semiconductor layer.

In another aspect of the present invention, a method for manufacturing a thin film type solar cell comprises forming a plurality of front electrodes on a substrate, and forming an auxiliary isolating part in the outermost front electrode, wherein the plurality of front electrodes are provided at fixed intervals by each first separating part interposed in-between; forming a plurality of semiconductor layers on the front electrodes, wherein the plurality of semiconductor layers are provided at fixed intervals by each contact part interposed in-between; forming a plurality of rear electrodes at fixed intervals by each second separating part interposed in-between, wherein the plurality of rear electrodes are connected with the front electrodes through the contact part; and forming a main isolating part in the outermost front electrode, the outermost semiconductor layer, and the outermost rear electrode among the plurality of front electrodes, semiconductor layers, and rear electrodes.

In another aspect of the present invention, a method for manufacturing a thin film type solar cell comprises forming a plurality of front electrodes on a substrate, wherein the plurality of front electrodes are provided at fixed intervals by each first separating part interposed in-between; forming a plurality of semiconductor layers on the front electrodes, wherein the plurality of semiconductor layers are provided at fixed intervals by each contact part interposed in-between; forming a plurality of rear electrodes at fixed intervals by each second separating part interposed in-between, wherein the plurality of rear electrodes are connected with the front electrodes through the contact part; forming an auxiliary isolating part in the outermost rear electrode among the plurality of rear electrodes; and forming a main isolating part in the outermost front electrode, the outermost semiconductor layer, and the outermost rear electrode among the plurality of front electrodes, semiconductor layers, and rear electrodes.

In another aspect of the present invention, a method for manufacturing a thin film type solar cell comprises forming a plurality of front electrodes on a substrate, and forming a first auxiliary isolating part in the outermost front electrode, wherein the plurality of front electrodes are provided at fixed intervals by each first separating part interposed in-between; forming a plurality of semiconductor layers on the front electrodes, wherein the plurality of semiconductor layers are provided at fixed intervals by each contact part interposed in-between; forming a plurality of rear electrodes at fixed intervals by each second separating part interposed in-between, wherein the plurality of rear electrodes are connected with the front electrodes through the contact part; forming a second auxiliary isolating part in the outermost rear electrode among the plurality of rear electrodes; and forming a main isolating part in the outermost front electrode, the outermost semiconductor layer, and the outermost rear electrode among the plurality of front electrodes, semiconductor layers, and rear electrodes.

At this time, the auxiliary isolating part is formed on the inside of the main isolating part.

The auxiliary isolating part is additionally formed in the outermost semiconductor layer during the step for forming the auxiliary isolating part in the outermost rear electrode.

The second auxiliary separating is additionally formed in the outermost semiconductor layer during the step for forming the second auxiliary isolating part in the outermost rear electrode.

The second auxiliary isolating part is formed between the first auxiliary isolating part and the main isolating part.

In addition, the method further comprises forming a transparent conductive layer between the semiconductor layer and the rear electrode, wherein the transparent conductive layer is identical in pattern to the semiconductor layer.

Also, the step for forming the auxiliary isolating part in the outermost rear electrode is performed after the step for forming the main isolating part.

Advantageous Effects

A thin film type solar cell according to the present invention and a method for manufacturing the same has the following advantages.

According as a first auxiliary isolating part 220 is formed in an outermost front electrode 200, or a second auxiliary isolating part 520 is formed in an outermost rear electrode 500, it is possible to prevent a short from occurring in an entire unit cell even though the outermost front and rear electrodes 200 and 500 are connected with each other during a process for forming a main isolating part 550.

When the first auxiliary isolating part 220 is formed in the outermost front electrode 200, and the second auxiliary isolating part 520 is formed in the outermost rear electrode 500, the outermost front electrode 200 can be perfectly separated from the outermost rear electrode 500. Thus, even though the outermost front and rear electrodes 200 and 500 are connected with each other during the process for forming the main isolating part 550, it is possible to prevent the short from occurring in the entire unit cell, and to prevent the increase of resistance.

BEST MODE

Reference will now be made in detail to the preferred embodiments of the present invention, examples of which are illustrated in the accompanying drawings. Wherever possible, the same reference numbers will be used throughout the drawings to refer to the same or like parts.

Hereinafter, a thin film type solar cell according to the present invention and a method for manufacturing the same will be described with reference to the accompanying drawings.

<Thin Film Type Solar Cell>

First Embodiment

Figure 1:
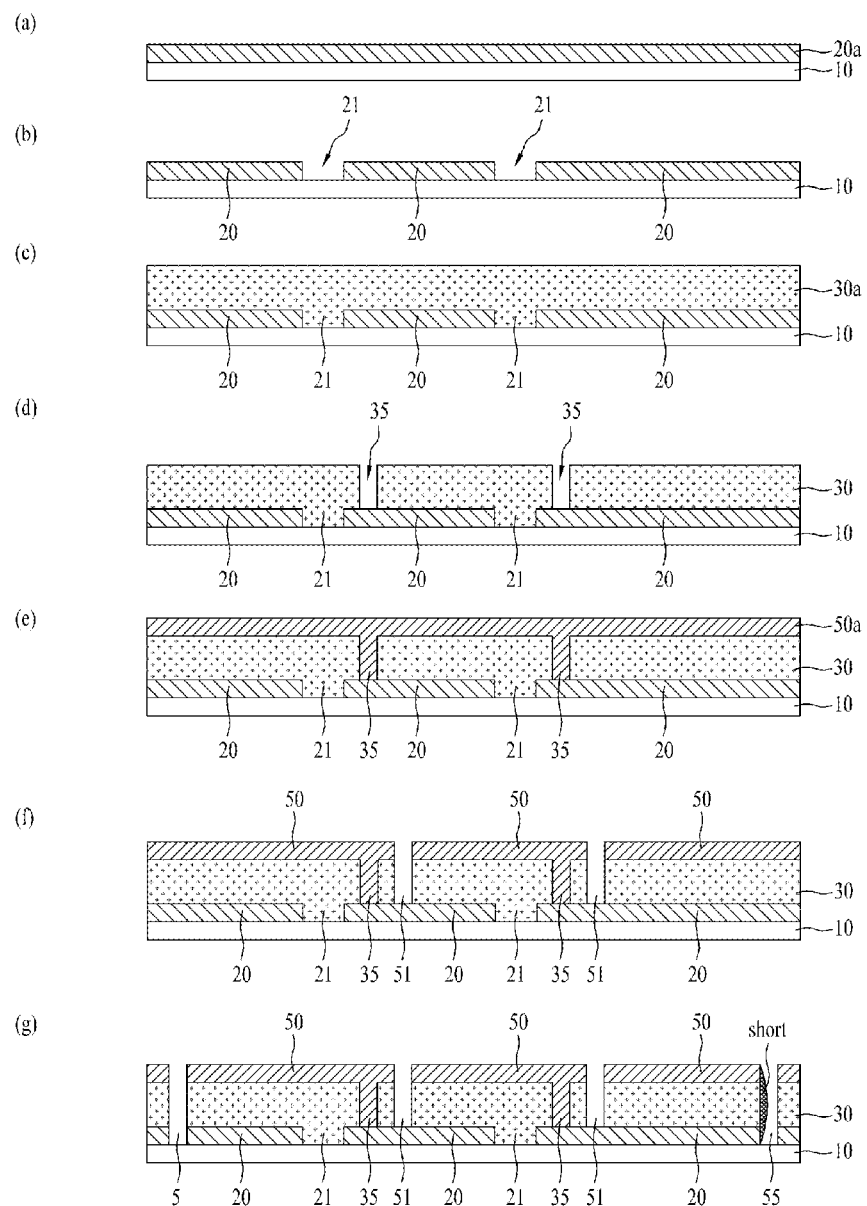
FIGS. 1A to 1G are cross section views illustrating a related art method for manufacturing a thin film type solar cell with a plurality of unit cells connected in series.
Figure 2:
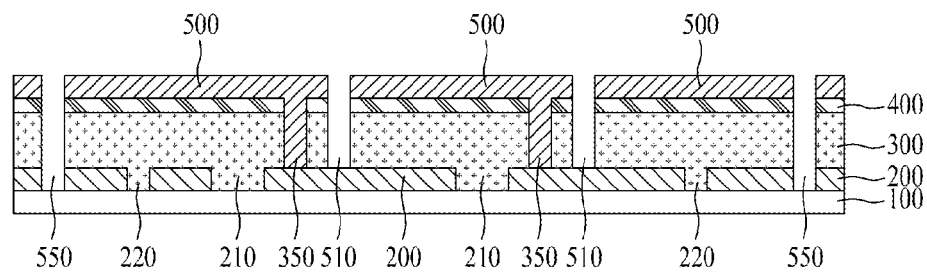
FIG. 2 is a cross section view illustrating a thin film type solar cell according to the first embodiment of the present invention.

FIG. 2 is a cross section view illustrating a thin film type solar cell according to the first embodiment of the present invention.

As shown in FIG. 2, the thin film type solar cell according to the first embodiment of the present invention includes a substrate 100, a front electrode 200, a semiconductor layer 300, a transparent conductive layer 400, and a rear electrode 500.

The substrate 100 may be formed of glass or transparent plastic.

The plurality of front electrodes 200 are formed on the substrate 100, wherein the plurality of front electrodes 200 are provided at fixed intervals by each first separating part 210 interposed in-between. At this time, a first auxiliary isolating part 220 and a main isolating part 550 are formed in the outermost front electrode 200 among the plurality of front electrodes 200.

The first separating part 210 divides the thin film type solar cell into a plurality of unit cells. When a predetermined housing is connected with the thin film type solar cell during a modular process of the completed thin film type solar cell, the main isolating part 550 prevents a short from occurring between the housing and the thin film type solar cell. The first auxiliary isolating part 220 is positioned on the inside of the main isolating part 550. Thus, even though the outermost front and rear electrodes 200 and 500 are connected with each other during a process for forming the main isolating part 550, the first auxiliary isolating part 220 prevents the short from occurring in the unit cell. When the outermost front and rear electrodes 200 and 500 are connected with each other in the main isolating part 550, the short may occur in the corresponding unit cell. The thin film type solar cell according to the first embodiment of the present invention additionally includes the first auxiliary isolating part 220 in the outermost front electrode 200, so that it is possible to prevent the short from occurring in the entire unit cell.

The front electrode 200 may be formed of a transparent conductive material, for example, ZnO, ZnO:B, ZnO:Al, ZnO:H, SnO$_2$, SnO$_2$:F, or ITO (Indium Tin Oxide). The front electrode 200 corresponds to a solar-ray incidence face. In this respect, it is important for the front electrode 200 to transmit solar rays into the inside of the solar cell with the minimized loss. For this, the front electrode 200 may have an uneven surface.

The plurality of semiconductor layers 300 are formed on the front electrodes 200, wherein the plurality of semiconductor layers 300 are provided at fixed intervals by each contact part 350 and second separating part 510 interposed in-between. At this time, the main isolating part 550 is formed in the outermost semiconductor layer 300 among the plurality of semiconductor layers 300.

The contact part 350 electrically connects the front electrode 200 with the rear electrode 500. The second separating part 510 divides the thin film type solar cell into the plurality of unit cells. As mentioned above, the main isolating part 550 prevents the short from occurring between the housing and the thin film type solar cell.

The semiconductor layer 300 may be formed of a silicon-based semiconductor material, for example, amorphous silicon or microcrystalline silicon. The semiconductor layer 300 is formed in a PIN structure where a P-type semiconductor layer, an I-type semiconductor layer, and an N-type semiconductor layer are deposited in sequence. In the semiconductor layer 300 with the PIN structure, depletion is generated in the I-type semiconductor layer by the P-type semiconductor layer and the N-type semiconductor layer, whereby an electric field occurs. Thus, electrons and holes generated by the solar ray are drifted by the electric field, and the drifted electrons and holes are collected in the P-type semiconductor layer and the N-type semiconductor layer. If forming the semiconductor layer 300 with the PIN structure, the P-type semiconductor layer is formed firstly, and then the I-type and N-type semiconductor layers are formed thereon, preferably. This is because a drift mobility of the hole is less than a drift mobility of the electron. In order to maximize the efficiency in collection of the incident light, the P-type semiconductor layer is provided adjacent to the light-incidence face.

The transparent conductive layer 400 is formed of a transparent conductive material, for example, ZnO, ZnO:B, ZnO:Al, or Ag. The transparent conductive layer 400 is formed on the semiconductor layer 300, wherein the transparent conductive layer 400 is identical in pattern to the semiconductor layer 300. That is, the plurality of transparent conductive layers 400 are provided at fixed intervals by the contact part 350 and second separating part 510 interposed in-between. At this time, the main isolating part 550 is formed in the outermost transparent conductive layer 400 among the plurality of transparent conductive layers 400.

The transparent conductive layer 400 may be omitted. However, it is preferable that the transparent conductive layer 400 be formed for improving the efficiency of the solar cell. That is, if forming the transparent conductive layer 400, the solar ray passes through the semiconductor layer 300, and then passes through the transparent conductive layer 400. In this case, the solar ray passing through the transparent conductive layer 400 is dispersed at different angles. As a result, the solar ray is reflected on the rear electrode 500, thereby resulting in the increase of solar ray re-incidence on the semiconductor layer 300.

The rear electrode 500 is electrically connected with the front electrode 200 through the contact part 350, wherein the plurality of rear electrodes 500 are provided at fixed intervals by the second separating part 510 interposed in-between. At this time, the main isolating part 550 is formed in the outermost rear electrode 500 among the plurality of rear electrodes 500. The rear electrode 500 may be formed of a metal material, for example, Ag, Al, Ag+Al, Ag+Mg, Ag+Mn, Ag+Sb, Ag+Zn, Ag+Mo, Ag+Ni, Ag+Cu, or Ag+Al+Zn.

Hereinafter, thin film type solar cells according to the second and third embodiments of the present invention will be explained as follows, wherein the detailed explanation for the same or like parts as those of the first embodiment of the present invention will be omitted.

Second Embodiment

Figure 3:
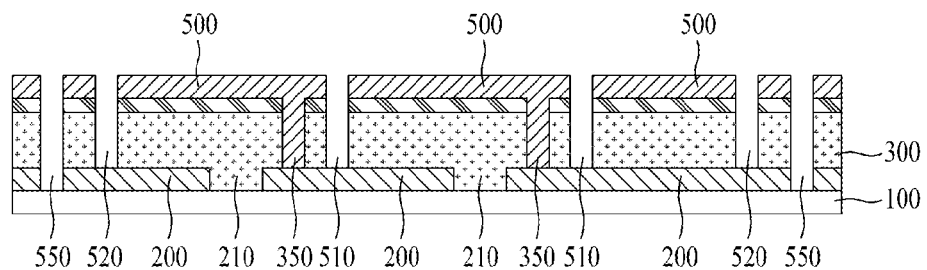
FIG. 3 is a cross section view illustrating a thin film type solar cell according to the second embodiment of the present invention.

FIG. 3 is a cross section view illustrating a thin film type solar cell according to the second embodiment of the present invention. Except that a second auxiliary isolating part 520 is formed in an outermost rear electrode 500 instead of forming the first auxiliary isolating part 220 in the outermost front electrode 200, the thin film type solar cell according to the second embodiment of the present invention is identical in structure to that according to the first embodiment of the present invention.

As shown in FIG. 3, the thin film type solar cell according to the second embodiment of the present invention includes a substrate 100, a front electrode 200, a semiconductor layer 300, a transparent conductive layer 400, and a rear electrode 500.

The plurality of front electrodes 200 are formed on the substrate 100, wherein the plurality of front electrodes 200 are provided at fixed intervals by each first separating part 210 interposed in-between. At this time, a main isolating part 550 is formed in the outermost front electrode 200 among the plurality of front electrodes 200.

The plurality of semiconductor layers 300 are formed on the front electrodes 200, wherein the plurality of semiconductor layers 300 are provided at fixed intervals by each contact part 350 and second separating part 510 interposed in-between. At this time, the second auxiliary isolating part 520 and main isolating part 550 are formed in the outermost semiconductor layer 300 among the plurality of semiconductor layers 300, wherein the second auxiliary isolating part 520 is positioned on the inside of the main isolating part 550. When forming the second auxiliary isolating part 520 in the outermost rear electrode 500, the second auxiliary isolating part 520 is also formed in the outermost semiconductor layer 300.

The transparent conductive layer 400 is formed on the semiconductor layer 300, wherein the transparent conductive layer 400 is identical in pattern to the semiconductor layer 300. That is, the plurality of transparent conductive layers 400 are provided at fixed intervals by the contact part 350 and second separating part 510 interposed in-between. At this time, the second auxiliary isolating part 520 and main isolating part 550 are formed in the outermost transparent conductive layer 400 among the plurality of transparent conductive layers 400.

The rear electrode 500 is electrically connected with the front electrode 200 through the contact part 350. The plurality of rear electrodes 500 are provided at fixed intervals by the second separating part 510 interposed in-between. At this time, the second auxiliary isolating part 520 and main isolating part 550 are formed in the outermost rear electrode 500 among the plurality of rear electrodes 500, wherein the second auxiliary isolating part 520 is positioned on the inside of the main isolating part 550.

Thus, even though the outermost front and rear electrodes 200 and 500 are connected with each other during the process for forming the main isolating part 550, the second auxiliary isolating part 520 prevents a short from occurring in the corresponding unit cell. When the outermost front and rear electrodes 200 and 500 are connected with each other in the main isolating part 500, the short may occur in the corresponding unit cell. However, the thin film type solar cell according to the second embodiment of the present invention additionally includes the second auxiliary isolating part 520 in the outermost rear electrode 500, so that it is possible to prevent the short from occurring in the entire unit cell.

Third Embodiment

Figure 4:
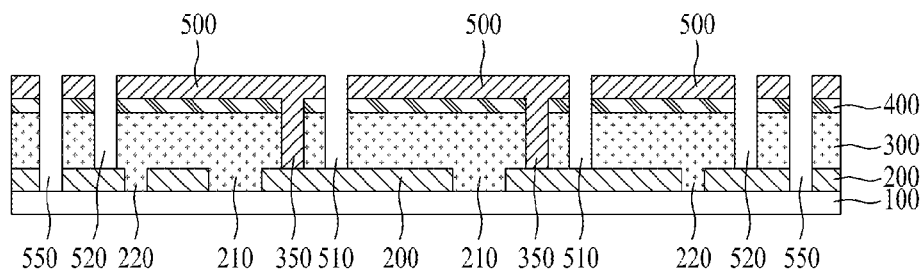
FIG. 4 is a cross section view illustrating a thin film type solar cell according to the third embodiment of the present invention.

FIG. 4 is a cross section view illustrating a thin film type solar cell according to the third embodiment of the present invention. Except that both first and second auxiliary isolating parts 220 and 520 are respectively formed in outermost front and rear electrodes 200 and 500, the thin film type solar cell according to the third embodiment of the present invention is identical in structure to that according to the first embodiment of the present invention.

As shown in FIG. 4, the thin film type solar cell according to the third embodiment of the present invention includes a substrate 100, a front electrode 200, a semiconductor layer 300, a transparent conductive layer 400, and a rear electrode 500.

The plurality of front electrodes 200 are formed on the substrate 100, wherein the plurality of front electrodes 200 are provided at fixed intervals by each first separating part 210 interposed in-between. At this time, the first auxiliary isolating part 220 and a main isolating part 550 are formed in the outermost front electrode 200 among the plurality of front electrodes 200.

The plurality of semiconductor layers 300 are formed on the front electrodes 200, wherein the plurality of semiconductor layers 300 are provided at fixed intervals by each contact part 350 and second separating part 510 interposed in-between. At this time, the second auxiliary isolating part 520 and main isolating part 550 are formed in the outermost semiconductor layer 300 among the plurality of semiconductor layers 300. The second auxiliary isolating part 520 may be formed between the first auxiliary isolating part 220 and the main isolating part 550.

The transparent conductive layer 400 is formed on the semiconductor layer 300, wherein the transparent conductive layer 400 is identical in pattern to the semiconductor layer 300. That is, the plurality of transparent conductive layers 400 are provided at fixed intervals by each contact part 350 and second separating part 510 interposed in-between. At this time, the second auxiliary isolating part 520 and main isolating part 550 are formed in the outermost transparent conductive layer 400 among the plurality of transparent conductive layers 400.

The rear electrode 500 is electrically connected with the front electrode 200 through the contact part 350. The plurality of rear electrodes 500 are provided at fixed intervals by each second separating part 510 interposed in-between. At this time, the second auxiliary isolating part 520 and main isolating part 550 are formed in the outermost rear electrode 500 among the plurality of rear electrodes 500.

In the aforementioned first embodiment of the present invention, the first auxiliary isolating part 220 is formed in the outermost front electrode 200, so that it is possible to prevent the short from occurring in the entire unit cell even though the outermost front and rear electrodes 200 and 500 are connected with each other during the process for forming the main isolating part 550. In the aforementioned second embodiment of the present invention, the second auxiliary isolating part 520 is formed in the outermost rear electrode 500, so that it is possible to prevent the short from occurring in the entire unit cell even though the outermost front and rear electrodes 200 and 500 are connected with each other during the process for forming the main isolating part 550.

In the first and second embodiments of the present invention, it is possible to prevent the short from occurring in the entire unit cell even though the outermost front and rear electrodes 200 and 500 are connected with each other during the process for forming the main isolating part 550. However, since the front and rear electrodes 200 and 500 in the outmost unit cell may be electrically connected with each other, a resistance is increased in the unit cell. Accordingly, the thin film type solar cell according to the third embodiment of the present invention includes both the first auxiliary isolating part 220 in the outermost front electrode 200 and the second auxiliary isolating part 520 in the outermost rear electrode 500, whereby the outermost front electrode 200 is perfectly separated from the outermost rear electrode 500, thereby preventing the short occurrence in the entire unit cell and preventing the increase of resistance.

<Method For Manufacturing Thin Film Type Solar Cell>

FIGS. 5A to 5G are cross section views illustrating a method for manufacturing a thin film type solar cell according to the first embodiment of the present invention.

Figure 5:
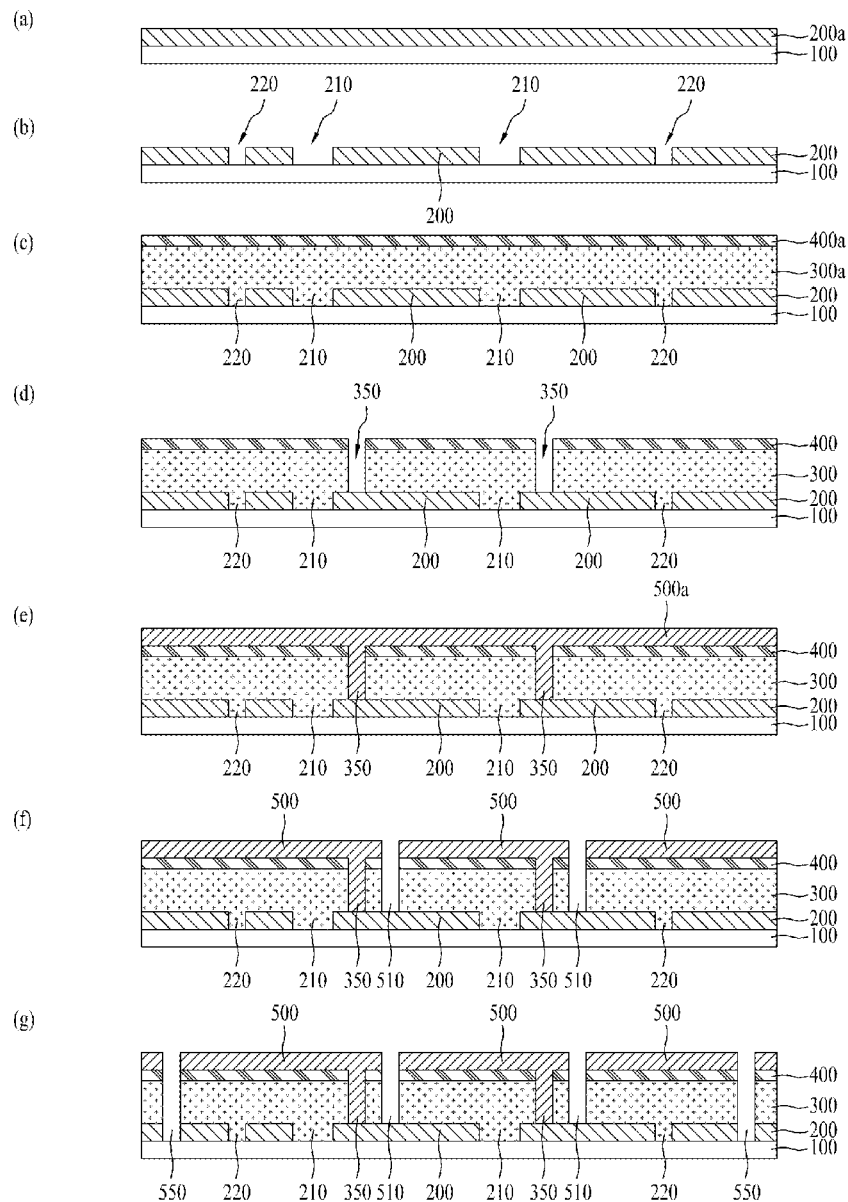
FIGS. 5A to 5G are cross section views illustrating a method for manufacturing a thin film type solar cell according to the first embodiment of the present invention.

First, as shown in FIG. 5A, a front electrode layer 200a is formed on a substrate 100.

The substrate 100 may be formed of glass or transparent plastic.

The front electrode layer 200a may be formed of a transparent conductive material, for example, ZnO, ZnO:B, ZnO:Al, $SnO_2$, $SnO_2$:F, or ITO (Indium Tin Oxide) by sputtering or MOCVD (Metal Organic Chemical Vapor Deposition).

The front electrode layer 200a corresponds to a solar-ray incidence face. In this respect, it is important for the front electrode layer 200a to transmit solar rays into the inside of the solar cell with the minimized loss. For this, a texturing process is additionally applied to the front electrode layer 200a.

Through the texturing process, a surface of material layer is provided with an uneven surface, that is, a texture structure, by an etching process using photolithography, an anisotropic etching process using a chemical solution, or a mechanical scribing process. According as the texturing process is performed to the front electrode layer 200a, a solar-ray reflection ratio on the solar cell is decreased and a solar-ray absorbing ratio on the solar cell is increased owing to a dispersion of the solar ray, thereby improving the solar cell efficiency.

As shown in FIG. 5B, a plurality of front electrodes 200 are formed by patterning the front electrode layer 200a, wherein the plurality of front electrodes 200 are provided at fixed intervals by each first separating part 210 interposed in-between. When patterning the front electrode layer 200a, a first auxiliary isolating part 220 is formed in the outermost front electrode 200 among the plurality of front electrodes 200.

The first separating part 210 and first auxiliary isolating part 220 may be formed by a laser-scribing process.

Meanwhile, the plurality of front electrodes 200 including the first separating part 210 and first auxiliary isolating part 220 may be directly formed on the substrate 100 by performing a simple method such as a screen printing method, an inkjet printing method, a gravure printing method, or a micro-contact printing method, instead of applying the laser-scribing process to the front electrode layer 200a after forming the front electrode layer 200a on an entire surface of the substrate 100 shown in FIGS. 5A and 5B.

In the case of the screen printing method, a material is transferred to a predetermined body through the use of a squeeze. The inkjet printing method sprays a material onto a predetermined body through the use of an inkjet, to thereby form a predetermined pattern thereon. In the case of the gravure printing method, a material is coated on an intaglio plate, and then the coated material is transferred to a predetermined body, thereby forming a predetermined pattern on the predetermined body. The micro-contact printing method forms a predetermined pattern of material on a predetermined body through the use of a predetermined mold.

If forming the front electrodes 200 through the screen printing method, the inkjet printing method, the gravure printing method, or the micro-contact printing method, there is less worry about contamination of the substrate, in comparison to the laser-scribing process, and there is no requirement for a cleaning process to prevent contamination of the substrate.

As shown in FIG. 5C, a semiconductor layer 300a and a transparent conductive layer 400a are sequentially formed on the substrate 100 including the front electrodes 200.

The semiconductor layer 300a may be formed of a silicon-based semiconductor material by a plasma CVD method. The semiconductor layer 300a may be formed in a PIN structure where a P-type semiconductor layer, an I-type semiconductor layer, and an N-type semiconductor layer are deposited in sequence.

The transparent conductive layer 400a may be formed of a transparent conductive material, for example, ZnO, ZnO:B, ZnO:Al, or Ag by sputtering or MOCVD (Metal Organic Chemical Vapor Deposition).

The transparent conductive layer 400a may be omitted. However, it is preferable that the transparent conductive layer 400a be formed for improving the efficiency of the solar cell.

Next, as shown in FIG. 5D, the semiconductor layer 300a and transparent conductive layer 400a are patterned at the same time, thereby forming a plurality of semiconductor layers 300 and transparent conductive layers 400. At this time, the plurality of semiconductor layers 300 and transparent conductive layers 400 deposited in sequence are provided at fixed intervals by each contact part 350.

The contact part 350 may be formed by a laser-scribing process.

As shown in FIG. 5E, a rear electrode layer 500a is formed on an entire surface of the substrate 100 including the transparent conductive layers 400, whereby the rear electrode layer 500a is connected with the front electrode 200 through the contact part 350.

The rear electrode layer 500a may be formed of a metal material, for example, Ag, Al, Ag+Al, Ag+Mg, Ag+Mn, Ag+Sb, Ag+Zn, Ag+Mo, Ag+Ni, Ag+Cu, or Ag+Al+Zn, by sputtering or printing.

As shown in FIG. 5F, the plurality of rear electrodes 500 are formed by patterning the rear electrode layer 500a, wherein the plurality of rear electrodes 500 are provided at fixed intervals by each second separating part 510 interposed in-between. When patterning the rear electrode layer 500a, the second separating part 510 may be formed in the transparent conductive layer 400 and semiconductor layer 300 positioned underneath the rear electrode layer 500a. The second separating part 510 may be formed by a laser-scribing process.

As shown in FIG. 5G, a main isolating part 550 is formed by patterning the outermost front electrode 200, the outermost semiconductor layer 300, the outermost transparent conductive layer 400, and the outermost rear electrode 500, thereby completing the process for manufacturing the thin film type solar cell of FIG. 2. The main isolating part 550 may be formed by a laser-scribing process. The main isolating part 550 is positioned on the outside of the first auxiliary isolating part 220.

Hereinafter, methods for manufacturing thin film type solar cells according to the second and third embodiments of the present invention will be explained as follows, wherein the detailed explanation for the same or like parts as those of the first embodiment of the present invention will be omitted.

FIGS. 6A to 6G are cross section views illustrating a method for manufacturing the thin film type solar cell according to the second embodiment of the present invention.

Figure 6:
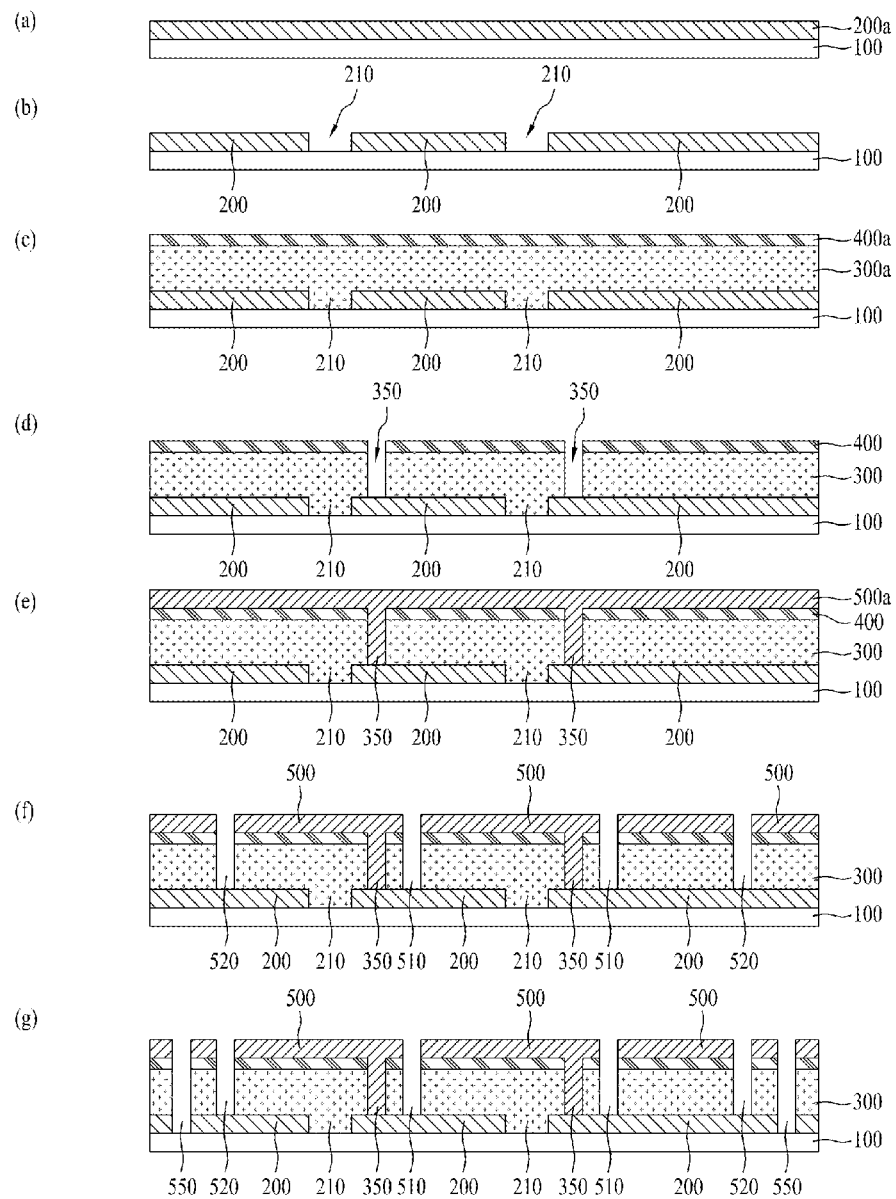
FIGS. 6A to 6G are cross section view illustrating a method for manufacturing a thin film type solar cell according to the second embodiment of the present invention.

First, as shown in FIG. 6A, a front electrode layer 200a is formed on a substrate 100.

As shown in FIG. 6B, a plurality of front electrodes 200 are formed by patterning the front electrode layer 200a, wherein the plurality of front electrodes 200 are provided at fixed intervals by each first separating part 210 interposed in-between.

As shown in FIG. 6C, a semiconductor layer 300a and a transparent conductive layer 400a are sequentially formed on an entire surface of the substrate 100 including the front electrodes 200.

As shown in FIG. 6D, the semiconductor layer 300a and transparent conductive layer 400a are patterned at the same time, thereby forming a plurality of semiconductor layers 300 and transparent conductive layers 400. At this time, the plurality of semiconductor layers 300 and transparent conductive layers 400 deposited in sequence are provided at fixed intervals by each contact part 350.

As shown in FIG. 6E, a rear electrode layer 500a is formed on an entire surface of the substrate 100 including the transparent conductive layers 400, whereby the rear electrode layer 500a is connected with the front electrode 200 through the contact part 350.

As shown in FIG. 6F, a plurality of rear electrodes 500 are formed by patterning the rear electrode layer 500a, wherein the plurality of rear electrodes 500 are provided at fixed intervals by each second separating part 510 interposed in-between. When patterning the rear electrode layer 500a, a second auxiliary isolating part 520 is formed in the outermost rear electrode 500 among the plurality of rear electrodes 500. The second auxiliary isolating part 520 may be formed after performing a process for forming a following main isolating part 550.

When patterning the rear electrode layer 500a, the second separating part 510 and second auxiliary isolating part 520 may be formed in the transparent conductive layer 400 and semiconductor layer 300 positioned underneath the rear electrode layer 500a.

As shown in FIG. 6G, the main isolating part 550 is formed by patterning the outermost front electrode 200, the outermost semiconductor layer 300, the outermost transparent conductive layer 400, and the outermost rear electrode 500, thereby completing the process for manufacturing the thin film type solar cell of FIG. 3. The main isolating part 550 is positioned on the outside of the second auxiliary isolating part 520.

FIGS. 7A to 7G are cross section views illustrating a method for manufacturing the thin film type solar cell according to the third embodiment of the present invention.

Figure 7:
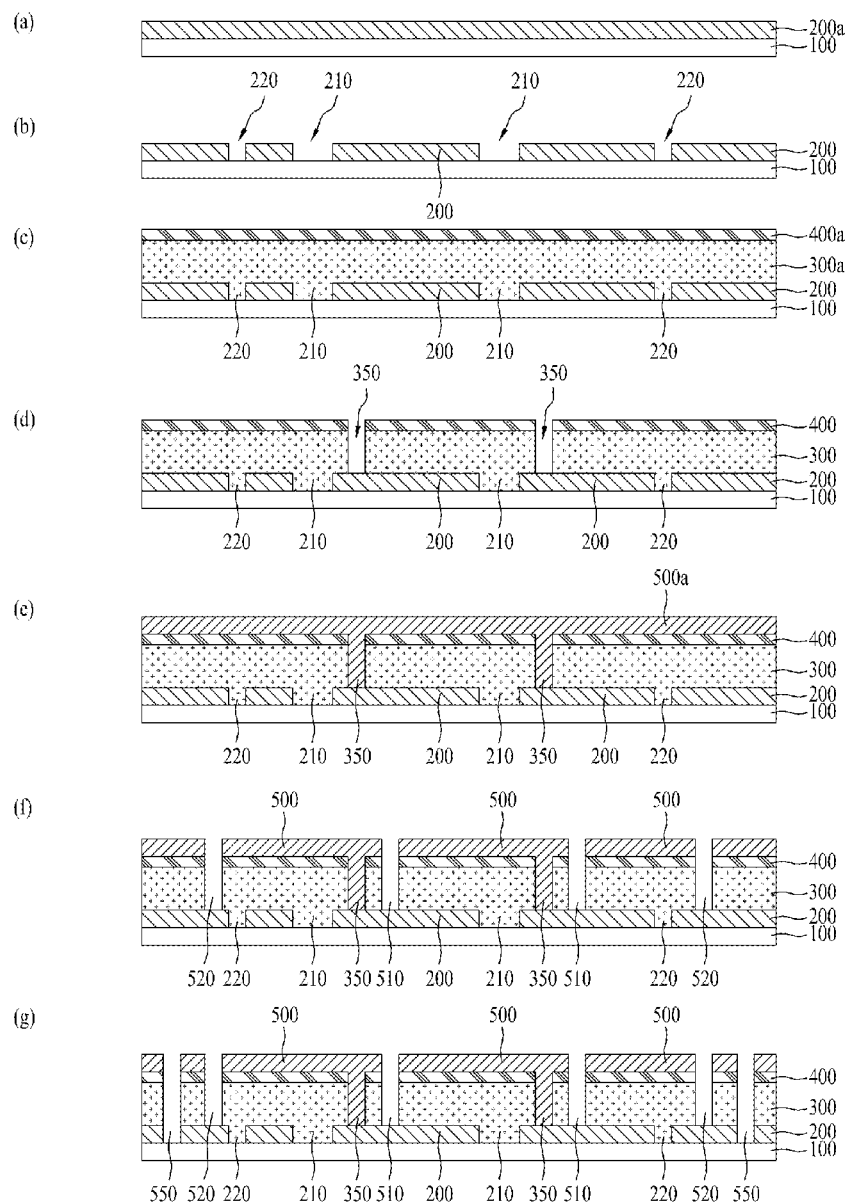
FIGS. 7A to 7G are cross section view illustrating a method for manufacturing a thin film type solar cell according to the third embodiment of the present invention.

As shown in FIG. 7A, a front electrode layer 200a is formed on a substrate 100.

As shown in FIG. 7B, a plurality of front electrodes 200 are formed by patterning the front electrode layer 200a, wherein the plurality of front electrodes 200 are provided at fixed intervals by each first separating part 210 interposed in-between. When patterning the front electrode layer 200a, a first auxiliary isolating part 220 is formed in the outermost front electrode 200 among the plurality of front electrodes 200.

As shown in FIG. 7C, a semiconductor layer 300a and a transparent conductive layer 400a are sequentially formed on an entire surface of the substrate 100 including the front electrodes 200.

As shown in FIG. 7D, the semiconductor layer 300a and transparent conductive layer 400a are patterned at the same time, thereby forming a plurality of semiconductor layers 300 and transparent conductive layers 400. At this time, the plurality of semiconductor layers 300 and transparent conductive layers 400 deposited in sequence are provided at fixed intervals by each contact part 350.

As shown in FIG. 7E, a rear electrode layer 500a is formed on an entire surface of the substrate 100 including the transparent conductive layers 400, whereby the rear electrode layer 500a is connected with the front electrode 200 through the contact part 350.

As shown in FIG. 7F, a plurality of rear electrodes 500 are formed by patterning the rear electrode layer 500a, wherein the plurality of rear electrodes 500 are provided at fixed intervals by each second separating part 510 interposed in-between. When patterning the rear electrode layer 500a, a second auxiliary isolating part 520 is formed in the outermost rear electrode 500 among the plurality of rear electrodes 500. The second auxiliary isolating part 520 may be formed after performing a process for forming a following main isolating part 550.

When patterning the rear electrode layer 500a, the second separating part 510 and second auxiliary isolating part 520 may be formed in the transparent conductive layer 400 and semiconductor layer 300 positioned underneath the rear electrode layer 500a. The second auxiliary isolating part 520 is positioned on the outside of the first auxiliary isolating part 220.

As shown in FIG. 7G, the main isolating part 550 is formed by patterning the outermost front electrode 200, the outermost semiconductor layer 300, the outermost transparent conductive layer 400, and the outermost rear electrode 500, thereby completing the process for manufacturing the thin film type solar cell of FIG. 4. The main isolating part 550 is positioned on the outside of the first and second auxiliary isolating parts 220 and 520.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A thin film type solar cell comprising:
   a substrate;
   a plurality of front electrodes on the substrate, wherein the plurality of front electrodes are separated at fixed intervals with first separating gaps therebetween;
   a plurality of semiconductor layers formed as a single layer directly on the plurality of front electrodes, wherein the plurality of semiconductor layers are separated at fixed intervals with contact openings therebetween;
   a plurality of rear electrodes formed directly on a top surface of the plurality of semiconductor layers, wherein the plurality of rear electrodes are connected to the plurality of front electrodes through the contact openings, and the plurality of rear electrodes are separated at fixed intervals with second separating gaps therebetween;
a main isolating gap in an outermost front electrode of a unit cell, an outermost semiconductor layer of the unit cell, and an outermost rear electrode of the unit cell; and
an auxiliary isolating gap in the outermost front electrode, wherein the auxiliary isolating gap is closer to an interior of the unit cell than the main isolating gap, and the auxiliary isolating gap prevents a short from occurring in the unit cell when the outermost front electrode is connected with the outermost rear electrode,
wherein the first separating gaps and the auxiliary isolating gap do not contain any material of the plurality of rear electrodes.

2. The thin film type solar cell of claim 1, wherein the auxiliary isolating gap further comprises a second auxiliary isolating gap in the outermost rear electrode, and the second auxiliary isolating gap also prevents a short from occurring in the unit cell when the outermost front electrode is connected with the outermost rear electrode.

3. The thin film type solar cell of claim 2, wherein the second auxiliary isolating gap is also in the outermost semiconductor layer.

4. The thin film type solar cell of claim 2, wherein the second auxiliary isolating gap is between the first auxiliary isolating gap and the main isolating gap.

5. A method for manufacturing a thin film type solar cell comprising:
forming a plurality of front electrodes on a substrate, wherein the plurality of front electrodes are separated at fixed intervals with first separating gaps therebetween;
forming an auxiliary isolating gap in the outermost front electrode of a unit cell;
forming a plurality of semiconductor layers as a single layer directly on the plurality of front electrodes, wherein the plurality of semiconductor layers are separated at fixed intervals with contact openings therebetween;
forming a plurality of rear electrodes directly on a top surface of the plurality of semiconductor layers, wherein the plurality of rear electrodes are separated at fixed intervals with second separating gaps therebetween, the plurality of rear electrodes are connected with the plurality of front electrodes through the contact openings, and the first separating gaps and the auxiliary isolating gap do not contain any material of the plurality of rear electrodes; and
forming a main isolating gap in an outermost front electrode of a unit cell, an outermost semiconductor layer of the unit cell, and an outermost rear electrode of the unit cell, wherein the auxiliary isolating gap prevents a short from occurring in the unit cell when the outermost front electrode is connected with the outermost rear electrode.

6. The method of claim 5, wherein the auxiliary isolating gap is closer to an interior of the unit cell than the main isolating gap.

7. The method of claim 5, further comprising forming a second auxiliary isolating gap in the outermost rear electrode of the unit cell, wherein the second auxiliary isolating gap also prevents a short from occurring in the unit cell when the outermost front electrode is connected with the outermost rear electrode.

8. The method of claim 7, wherein the second auxiliary isolating gap is also formed in the outermost semiconductor layer of the unit cell.

9. The method of claim 7, wherein the second auxiliary isolating gap is formed between the first auxiliary isolating gap and the main isolating gap.

10. The method of claim 7, wherein forming the second auxiliary isolating gap in the outermost rear electrode is performed after forming the main isolating gap.

11. A thin film type solar cell comprising:
a substrate;
a plurality of front electrodes on the substrate, wherein the plurality of front electrodes are separated at fixed intervals with first separating gaps therebetween;
a plurality of semiconductor layers formed as a single layer directly on the plurality of front electrodes, wherein the plurality of semiconductor layers are separated at fixed intervals with contact openings therebetween;
a plurality of transparent conductive layers formed directly on a top surface of the plurality of semiconductor layers, wherein the plurality of transparent conductive layers are separated at fixed intervals with the contact openings therebetween;
a plurality of rear electrodes formed directly on a top surface of the plurality of transparent conductive layers, wherein the plurality of rear electrodes are connected to the plurality of front electrodes through the contact openings, and the plurality of rear electrodes are separated at fixed intervals with second separating gaps therebetween;
a main isolating gap in an outermost front electrode of a unit cell, an outermost semiconductor layer of the unit cell, and an outermost rear electrode of the unit cell; and
an auxiliary isolating gap in the outermost front electrode, wherein the auxiliary isolating gap is closer to an interior of the unit cell than the main isolating gap, and the auxiliary isolating gap prevents a short from occurring in the unit cell when the outermost front electrode is connected with the outermost rear electrode,
wherein the first separating gaps and the auxiliary isolating gap do not contain any material of the plurality of rear electrodes.

12. The thin film type solar cell of claim 11, wherein the auxiliary isolating gap further comprises a second auxiliary isolating gap in the outermost rear electrode, and the second auxiliary isolating gap also prevents a short from occurring in the unit cell when the outermost front electrode is connected with the outermost rear electrode.

13. The thin film type solar cell of claim 12, wherein the second auxiliary isolating gap is also in the outermost semiconductor layer and an outermost transparent conductive layer.

14. The thin film type solar cell of claim 12, wherein the second auxiliary isolating gap is between the first auxiliary isolating gap and the main isolating gap.

15. A method for manufacturing a thin film type solar cell comprising:
forming a plurality of front electrodes on a substrate, wherein the plurality of front electrodes are separated at fixed intervals with first separating gaps therebetween;
forming an auxiliary isolating gap in the outermost front electrode of a unit cell;
forming a plurality of semiconductor layers as a single layer directly on the plurality of front electrodes, wherein the plurality of semiconductor layers are separated at fixed intervals with contact openings therebetween;

forming a plurality of transparent conductive layers directly on a top surface of the plurality of semiconductor layers, wherein the plurality of transparent conductive layers are separated at fixed intervals with the contact openings therebetween;

forming a plurality of rear electrodes directly on a top surface of the plurality of transparent conductive layers, wherein the plurality of rear electrodes are separated at fixed intervals with second separating gaps therebetween, the plurality of rear electrodes are connected with the plurality of front electrodes through the contact openings, and the first separating gaps and the auxiliary isolating gap do not contain any material of the plurality of rear electrodes; and forming a main isolating gap in an outermost front electrode of a unit cell, an outermost semiconductor layer of the unit cell, and an outermost rear electrode of the unit cell, wherein the auxiliary isolating gap prevents a short from occurring in the unit cell when the outermost front electrode is connected with the outermost rear electrode.

16. The method of claim 15, wherein the auxiliary isolating gap is closer to an interior of the unit cell than the main isolating gap.

17. The method of claim 15, further comprising forming a second auxiliary isolating gap in the outermost rear electrode of the unit cell, wherein the second auxiliary isolating gap also prevents a short from occurring in the unit cell when the outermost front electrode is connected with the outermost rear electrode.

18. The method of claim 17, wherein the second auxiliary isolating gap is also formed in the outermost semiconductor layer of the unit cell and an outermost transparent conductive layer.

19. The method of claim 17, wherein the second auxiliary isolating gap is formed between the first auxiliary isolating gap and the main isolating gap.

20. The method of claim 17, wherein forming the second auxiliary isolating gap in the outermost rear electrode is performed after forming the main isolating gap.

* * * * *